US012674076B2

(12) United States Patent
Kim et al.

(10) Patent No.: US 12,674,076 B2
(45) Date of Patent: Jul. 7, 2026

(54) CHARACTERISTIC STUDY OF ACRYLIC POLYMER DISPERSANT COATED ON SURFACE OF POLISHING PARTICLE

(71) Applicants: Hannam University Industry Academy Cooperation Foundation, Daejeon-si (KR); MS Materials Co., Ltd., Gongju-si (KR)

(72) Inventors: Woon Jung Kim, Daejeon-si (KR); Yang Hoon Ji, Gongju-si (KR)

(73) Assignees: Hannam University Industry Academy Cooperation Foundation, Daejeon-si (KR); MS Materials Co., Ltd., Gongju-si (KR)

( * ) Notice: Subject to any disclaimer, the term of this patent is extended or adjusted under 35 U.S.C. 154(b) by 226 days.

(21) Appl. No.: 18/519,537

(22) Filed: Nov. 27, 2023

(65) Prior Publication Data

US 2024/0199916 A1 Jun. 20, 2024

(30) Foreign Application Priority Data

Dec. 19, 2022 (KR) ........................ 10-2022-0178787

(51) Int. Cl.
    *C09G 1/02*      (2006.01)
    *H10P 52/40*     (2026.01)
(52) U.S. Cl.
    CPC .............. *C09G 1/02* (2013.01); *H10P 52/402* (2026.01)
(58) Field of Classification Search
    None
    See application file for complete search history.

(56) References Cited

U.S. PATENT DOCUMENTS

| | | | | |
|---|---|---|---|---|
| 3,926,893 | A | * 12/1975 | Woodward | ............... C09G 1/10 |
| | | | | 524/285 |
| 2003/0073779 | A1* | 4/2003 | Tamori | .................. C08F 283/12 |
| | | | | 524/588 |
| 2009/0042166 | A1* | 2/2009 | Craig | ........................ A61C 3/02 |
| | | | | 451/28 |
| 2010/0003904 | A1* | 1/2010 | Duescher | .............. B24B 37/245 |
| | | | | 51/293 |
| 2016/0108257 | A1* | 4/2016 | Schlechte | ................ B05D 5/00 |
| | | | | 427/289 |
| 2018/0258319 | A1* | 9/2018 | Akutsu | .................... C09G 1/00 |
| 2025/0197674 | A1* | 6/2025 | Suzuki | ..................... C09G 1/02 |

FOREIGN PATENT DOCUMENTS

KR      1020130078791 A      7/2013

* cited by examiner

*Primary Examiner* — Shamim Ahmed
(74) *Attorney, Agent, or Firm* — Rabin & Berdo, P.C.

(57) ABSTRACT

The invention relates to a polishing slurry composition, and more specifically, relates to a polishing slurry composition that has excellent thermal stability, dispersion stability, stability over time, and polishing efficiency compared to conventional polishing slurry compositions, and can minimize scratches on the surface to be polished. The polishing slurry composition of the present invention has excellent thermal stability, dispersion stability, stability over time, and polishing efficiency, so it can be widely used in fields such as abrasives for semiconductor wafer processing, biomedical, pharmaceutical, cosmetics, and catalysts.

3 Claims, 7 Drawing Sheets

(a)        (b)        (c)

| Sample name | D104-5 | D104-6 | D104-7 |
|---|---|---|---|
| Average angle (°) | 9.08 | 7.18 | 5.91 |
| Wetting energy(m·N/m) | 71.89 | 72.23 | 72.41 |
| Work of adhesion(m·N/m) | 144.7 | 145.0 | 145.2 |

FIG. 4

| Sample name | pH | Conductivity |
|---|---|---|
| D104-5 | 9.46 | 423.2 |
| D104-6 | 9.51 | 508.4 |
| D104-7 | 9.49 | 701.8 |

Wavenumber (cm-1)

CHARACTERISTIC STUDY OF ACRYLIC POLYMER DISPERSANT COATED ON SURFACE OF POLISHING PARTICLE

TECHNICAL FIELD

The present invention relates to a polishing slurry composition, and more specifically, relates to a polishing slurry composition that has excellent thermal stability, dispersion stability, stability over time, and polishing efficiency compared to conventional polishing slurry compositions, and can minimize scratches on the surface to be polished.

BACKGROUND ART

As semiconductor devices become more highly integrated and performant, the line width of the wiring pattern becomes finer and the structure becomes more and more multi-layered, so that inter-layer flatness in each process is very important to improve the precision of photolithography.

Currently, the most popular planarization technology is the CMP (chemical-mechanical polishing) process. Depending on the material to be polished, the CMP process is classified as an oxide CMP process, a metal CMP process, a poly-Si CMP process etc.

Initially, a CMP slurry composition containing silica particles was mainly used to polish the oxide film.

However, as the design rule becomes smaller, the device becomes thinner, and high planarization becomes necessary, CMP slurry compositions containing cerium oxide particles which have high polishing selectivity for wafer with heterogeneous films are being applied.

The CMP slurry composition containing cerium oxide particles has a high polishing rate for the silicon oxide film and a low polishing rate for the silicon nitride film, so when a stepped silicon oxide film and a silicon nitride film are polished together, the silicon oxide film is polished and the silicon nitride film is not polished.

Therefore, by applying the CMP slurry composition containing cerium oxide particles to the oxide film CMP process, global planarization and precise control of polishing thickness are possible.

Meanwhile, the polishing slurry composition generates a large amount of heat and bubbles during the dispersion process, causing agglomeration and precipitation of the dispersed particles, which increases milling time, deteriorates workability and processability, generates scratches during polishing, and reduces polishing efficiency.

Therefore, there is an increasing demand for a polishing slurry composition that has excellent thermal stability, dispersion stability, stability over time, and polishing efficiency, and can minimize scratches on the surface to be polished.

PRIOR ART DOCUMENT

Korean Patent Publication No. 10-2013-0078791

RELATED PROJECT

Project number: RS-2023-00281517,
Ministry name: Ministry of Science and ICT/National Research Foundation of Korea,
Research project name: National Semiconductor Research Laboratory Sup port Core Technology Development Project (R&D),
Research project name: Development of core technology for next-generation semiconductor materials and processes for CMP process and training of semi conductor experts
Research period: 2023.08.01~2027.12.31

DISCLOSURE

Technical Problem

The present invention is to solve the problems of the prior art, and an object of the present invention is to provide a polishing slurry composition that has excellent thermal stability, dispersion stability, stability over time, and polishing efficiency, and can minimize scratches on the surface to be polished.

Technical Solution

The present invention provides a polishing slurry composition comprising:

(a) one or more abrasives selected from aluminum oxide, silicon oxide, zirconium oxide, and cerium oxide;

(b) one or more dispersants selected from ethylene-acrylic acid copolymers, salts of ethylene-acrylic acid copolymers, styrene-maleic acid copolymers and styrene-acrylic acid copolymers; and (c) a liquid carrier.

In one embodiment of the present invention, the composition includes 5 to 45% by weight of an abrasive, 1 to 15% by weight of a dispersant, and the remaining amount of a liquid carrier.

In one embodiment of the present invention, it is characterized that the abrasive is cerium oxide.

In one embodiment of the present invention, the composition additionally comprises pH adjusting agent which is selected from trimethanolamine, triethanolamine, trimethylammonium hydroxide, triethylammonium hydroxide, dimethylbenzylamine, ethoxybenzylamine, sodium hydroxide, and potassium hydroxide.

In one embodiment of the present invention, the composition additionally comprises 2 to 10% by weight of a silane coupling agent oligomer.

Advantageous Effect

The present invention can provide a polishing slurry composition that has excellent thermal stability, dispersion stability, stability over time, and polishing efficiency, and can minimize scratches on the surface to be polished.

In addition, the polishing slurry composition of the present invention has excellent thermal stability, dispersion stability, stability over time, and polishing efficiency, so it can be widely used in fields such as abrasives for semiconductor wafer processing, biomedical, pharmaceutical, cosmetics, and catalysts.

BRIEF EXPLANATION OF DRAWINGS

FIG. 4 shows the pH and Conductivity of the polishing slurry composition of the present invention.

MODE FOR THE INVENTION

Figure 1:
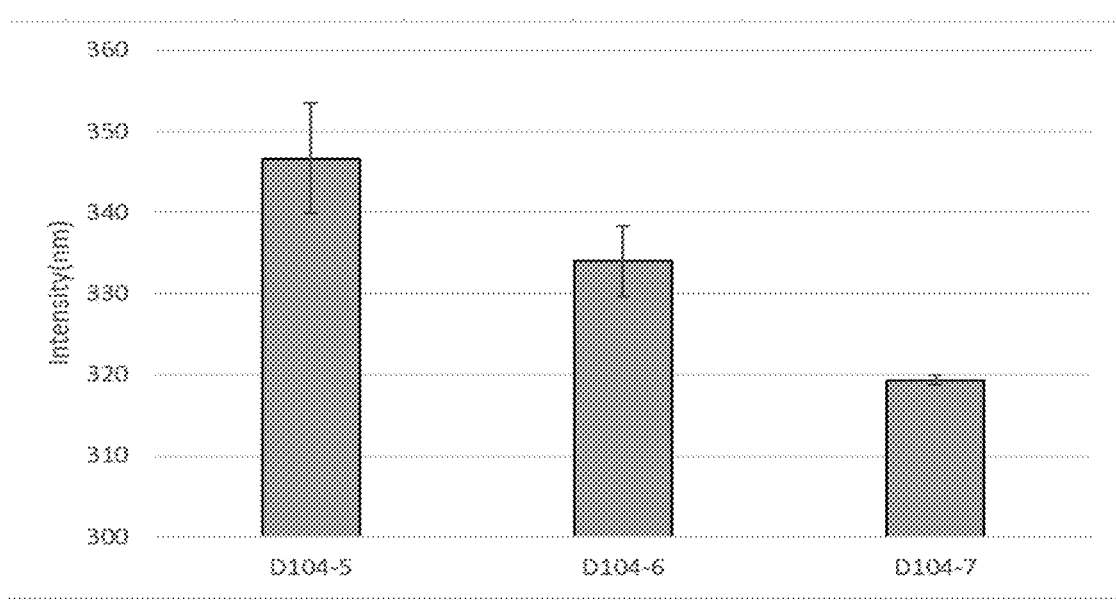
FIG. 1 shows the dispersibility of the polishing slurry composition of the present invention.

The present invention will be described in detail based on the following examples. The terms, examples, etc. used in the present invention are merely exemplified to explain the present invention in more detail and help the understanding of those skilled in the art, and the scope of the present invention should not be construed as being limited thereto.

Technical terms and scientific terms used in the present invention represent meanings commonly understood by those of ordinary skill in the art to which this invention belongs, unless otherwise defined.

The present invention relates to a polishing slurry composition comprising:

(a) one or more abrasives selected from aluminum oxide, silicon oxide, zirconium oxide, and cerium oxide;

(b) one or more dispersants selected from ethylene-acrylic acid copolymers, salts of ethylene-acrylic acid copolymers, styrene-maleic acid copolymers and styrene-acrylic acid copolymers; and (c) a liquid carrier.

The abrasive is intended to polish the wafer surface and can be used without limitation as long as it is commonly used during the wafer CMP process.

One example of abrasive may be a metal oxide, and more specifically, it may include one or more selected from aluminum oxide, silicon oxide, zirconium oxide, cerium oxide, titanium oxide, magnesium oxide, molybdenum oxide, etc., or a chemical addition mixture thereof.

The abrasive may be selected from the group consisting of aluminum oxide, silicon oxide, zirconium oxide, cerium oxide, and combinations thereof. More preferably, cerium oxide (ceria) is used to ensure uniform particle size and small particle hardness.

The particle size of the abrasive is preferably 50 to 1,000 nm, and the particle size can be measured using a particle size distribution meter (Horiba device, etc.) or laser diffraction.

If the particle size of the abrasive is less than 50 nm, the polishing speed and polishing efficiency decrease, and if it exceeds 1,000 nm, scratches and defects on the surface to be polished increase.

The manufacturing method of the abrasive is not particularly limited as long as it is a metal oxide particle manufacturing method applied in the art, and a solid-phase method, a liquid-phase method, etc. may be used.

The abrasive may be used in an amount of 5 to 45% by weight, preferably 5 to 20% by weight, based on 100% by weight of the total polishing slurry composition. If the content of the abrasive is less than 5% by weight, the polishing speed decreases, and if it exceeds 45% by weight, the dispersibility of the composition is low and a large amount of scratches may occur on the surface to be polished.

The dispersant can be used to improve the dispersion stability and polishing performance of the polishing slurry composition by binding to the surface of the abrasive.

The dispersant may be one or more selected from ethylene-acrylic acid copolymer, salt of ethylene-acrylic acid copolymer, styrene-maleic acid copolymer, and styrene-acrylic acid copolymer.

The salt of the ethylene-acrylic acid copolymer may be a zinc salt of the ethylene-acrylic acid copolymer, a sodium salt of the ethylene-acrylic acid copolymer, or a magnesium salt of the ethylene-acrylic acid copolymer.

The dispersant is coated on the surface of the abrasive to prevent agglomeration and precipitation of the abrasive and can improve dispersibility and uniformity by reducing the particle size of the abrasive.

In the present invention, a mixture of ethylene-acrylic acid copolymer and a salt of ethylene-acrylic acid copolymer can be used as a dispersant, and the weight ratio of the ethylene-acrylic acid copolymer and the salt of ethylene-acrylic acid copolymer is 60 to 80:20 to 40.

If the weight ratio satisfies the above numerical range, polishing efficiency and dispersibility can be maximized.

In addition, the dispersant can be used by mixing ethylene-acrylic acid copolymer, salt of ethylene-acrylic acid copolymer, and styrene-maleic acid copolymer, wherein the weight ratio of ethylene-acrylic acid copolymer, salt of ethylene-acrylic acid copolymer, and styrene-maleic acid copolymer is preferably 100:30 to 50:10 to 30.

If the weight ratio satisfies the above numerical range, polishing efficiency and dispersibility can be maximized.

In addition, the dispersant can be used by mixing ethylene-acrylic acid copolymer, salt of ethylene-acrylic acid copolymer, styrene-maleic acid copolymer, and styrene-acrylic acid copolymer. In this case, the weight ratio of ethylene-acrylic acid copolymer, ethylene-acrylic acid copolymer of salt, styrene-maleic acid copolymer and styrene-acrylic acid copolymer is preferably 100:30 to 50:10 to 30:5 to 20.

If the weight ratio satisfies the above numerical range, polishing efficiency and dispersibility can be maximized.

The dispersant is preferably contained in an amount of 1 to 15% by weight, preferably 3 to 10% by weight, based on 100% by weight of the total polishing slurry composition. If the dispersant content is less than 1% by weight, dispersion stability is reduced, and if it exceeds 15% by weight, a large amount of scratches occur on the surface to be polished and polishing efficiency is reduced.

The liquid carrier is used to disperse the abrasive, and any liquid carrier can be used if it can be mixed with the abrasive and the dispersant to form a dispersion or slurry. A suitable liquid carrier is a polar solvent, preferably ultrapure water (deionized water), distilled water, etc.

The polishing slurry composition of the present invention may further include a pH adjuster to maintain the zeta potential constant.

The pH adjuster is used to adjust the pH of the polishing slurry composition to a range of 8 to 11, and the type of pH adjuster is not limited if it can achieve the purpose of the present invention.

For example, the pH adjuster comprises Trimethanolamine, Triethanolamine, Trimethylammonium hydroxide, Triethylammonium hydroxide, Dimethylbenzylamine, Ethoxybenzylamine, sodium hydroxide, and potassium hydroxide, etc., and may be included in an amount of 0.0001 to 5% by weight based on 100% by weight of the total slurry composition.

If the content of the pH adjuster satisfies the above numerical range, polishing efficiency and dispersibility can be maximized.

In addition, the polishing slurry composition may further include a silane coupling agent oligomer to improve dispersibility.

The silane coupling agent oligomer may be prepared by reacting an acrylate group-containing silane coupling agent, an epoxy group-containing silane coupling agent, 2-hydroxyethyl acrylate (HEA), and 2-hydroxyethyl methacrylate (HEMA).

The silane coupling agent oligomer is bonded to the surface of the abrasive to prevent agglomeration and precipitation of the abrasive and can improve dispersibility and uniformity by reducing the particle size of the abrasive.

The acrylate group-containing silane coupling agent includes 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, methacryloxymethyltriethoxysilane, and methacryloxymethyltrimethoxysilane.

The epoxy group-containing silane agent includes 2-glycidoxyethylmethyldimethoxysilane, 2-glycidoxyethylmethyldiethoxysilane, 3-glycidoxypropylmethyldimethoxysilane, 3-glycidoxypropylmethyldiethoxysilane, 2-glycidoxyethyltrimethoxysilane, 2-glycidoxyethyltriethoxysilane, 3-glycidoxypropyltrimethoxysilane, 3-glycidoxypropyltriethoxysilane, 2-(3,4-epoxycyclohexyl)ethylmethyldimethoxysilane, 2-(3,4-epoxycyclohexyl)ethylmethyldiethoxysilane, 3-(3,4-epoxycyclohexyl)propylmethyldimethoxysilane, 3-(3,4-epoxycyclohexyl)propylmethyldiethoxysilane, 2-(3,4-epoxycyclohexyl)ethyltrimethoxysilane, 2-(3,4-epoxycyclohexyl)ethyltriethoxysilane, 3-(3,4-epoxycyclohexyl)propyltrimethoxysilane, 3-(3,4-epoxycyclohexyl)propyltriethoxysilane, etc.

The weight ratio of the acrylate group-containing silane coupling agent, the epoxy group-containing silane coupling agent, 2-hydroxyethyl acrylate (HEA), and 2-hydroxyethyl methacrylate (HEMA) is 10 to 40:100:20 to 50:10 to 30, and when the weight ratio satisfies the above numerical range, polishing efficiency and dispersibility can be maximized.

The weight average molecular weight of the oligomer is preferably 5,000 to 50,000 g/mol.

The oligomer is preferably used in an amount of 2 to 10% by weight based on 100% by weight of the total polishing slurry composition, and when the content satisfies the above numerical range, polishing efficiency and dispersibility can be maximized.

In addition, in order to improve dispersibility, the polishing slurry composition may further include a silane coupling agent oligomer prepared by reacting an acrylate group-containing silane coupling agent, an epoxy group-containing silane coupling agent, bisphenol A, 2-hydroxyethyl acrylate (HEA), and 2-hydroxyethyl methacrylate (HEMA).

The weight ratio of the acrylate group-containing silane coupling agent, the epoxy group-containing silane coupling agent, bisphenol A, 2-hydroxyethyl acrylate (HEA), and 2-hydroxyethyl methacrylate (HEMA) is 10 to 40:100:15 to 35:20 to 50:10 to 30, and if the weight ratio satisfies the above numerical range, polishing efficiency and dispersibility can be maximized.

The weight average molecular weight of the oligomer is preferably 5,000 to 50,000 g/mol.

The oligomer is preferably used in an amount of 2 to 10% by weight based on 100% by weight of the total polishing slurry composition, and when the content satisfies the above numerical range, polishing efficiency and dispersibility can be maximized.

The present invention can polish the surface of a substrate with a slurry composition using a known polishing system. The substrate is not limited to the type as long as it is commonly used in the industry, and may include silicon oxide, silicon nitride, polycrystalline silicon, etc., for example, borophosphosilicate glass (BPSG), plasma enhanced tetraethyl ortho silicate (PETEOS), thermal oxide, nitrogen-doped silicate glass, undoped silicate glass, and high-density plasma (HDP) oxide.

In the present invention, the polishing system may be manufactured using conventional techniques. In one example, a wafer is fixed in a polishing system including a fiber polishing pad, the wafer is pressed into contact with the polishing pad while controlling pressure, speed, and temperature conditions, the pad and the wafer are moved relative to each other, and then a slurry composition is applied to the wafer.

The present invention will be described in detail through Examples and Comparative Examples below. The following examples are only exemplified for the practice of the present invention, and the content of the present invention is not limited by the following examples.

Example 1

A polishing slurry composition was prepared by adding 30% by weight of cerium oxide particles with an average particle diameter of 100 nm, an ethylene-acrylic acid copolymer (dispersant), and the remaining amount of ultrapure water and stirring for 2 hours.

The content of ethylene-acrylic acid copolymer was 5% by weight, 6% by weight, and 7% by weight.

FIG. 1 shows the dispersibility of the polishing slurry composition of the present invention.

D104-5, D104-6, and D104-7 represent polishing slurry compositions containing 5% by weight, 6% by weight, and 7% by weight of ethylene-acrylic acid copolymer, respectively.

FIG. 1 shows the results of measuring the intensity value based on the PSD and mean value of the particle size of the reference slurry and the manufactured slurry using the laser diffraction/scattering equation, and it means the degree of aggregation between the particles and the dispersant measured after 100 days at room temperature.

As a result of the measurement, it can be seen that as the content of the dispersant increases, the agglomeration of the particles decreases and the original state is maintained. This is because the dispersant is well adsorbed on the surface of the abrasive particles, increasing the electrostatic repulsion between particles, thereby increasing the dispersibility of the particles.

Figure 2:
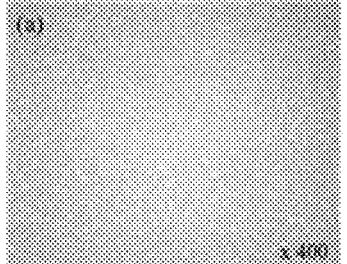
FIG. 2 shows an OM image of the polishing slurry composition of the present invention.
Figure 2:
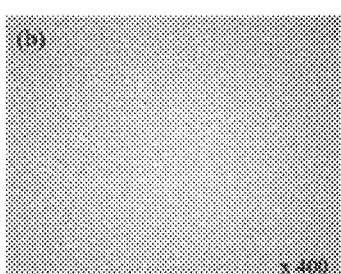
Figure 2:
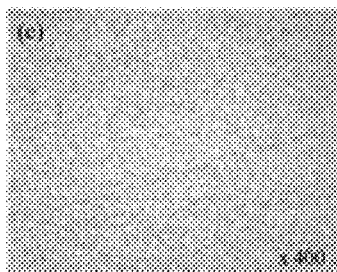

FIG. 2 shows an OM image of the polishing slurry composition of the present invention.

All three types of slurries showed no agglomeration of particles and showed a uniform dispersion state. In particular, the dispersibility of D104-5(a) and D104-6(b) was similar to each other, and D104-7(c) showed a slightly different dispersibility.

Figure 3:
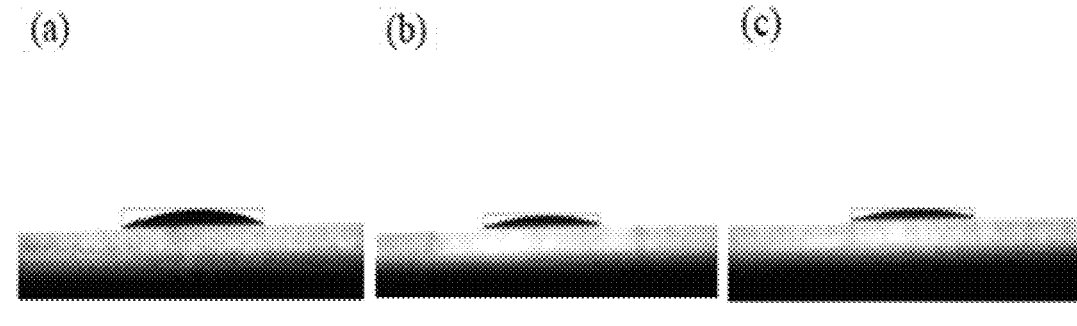
FIG. 3 shows the contact angle of the polishing slurry composition of the present invention.

FIG. 3 shows the contact angle of the polishing slurry composition of the present invention.

Looking at the contact angle measurement results, as the content of the dispersant in the slurry increases, the carboxyl group increases and the hydrophilicity gradually increases. As a result, the surface energy and work of adhesion values also tend to increase.

FIG. 4 shows the pH and conductivity of the polishing slurry composition of the present invention.

As a result of pH measurement, it was confirmed that the pH was constant even as the content of the dispersant increased. On the other hand, the conductivity measurement results showed that as the dispersant content increased, the conductivity measurement value tended to increase. This is due to the effect of the ionic component contained in the dispersant and the difference in the content of the dispersant adsorbed on the ceria surface.

Figure 5:
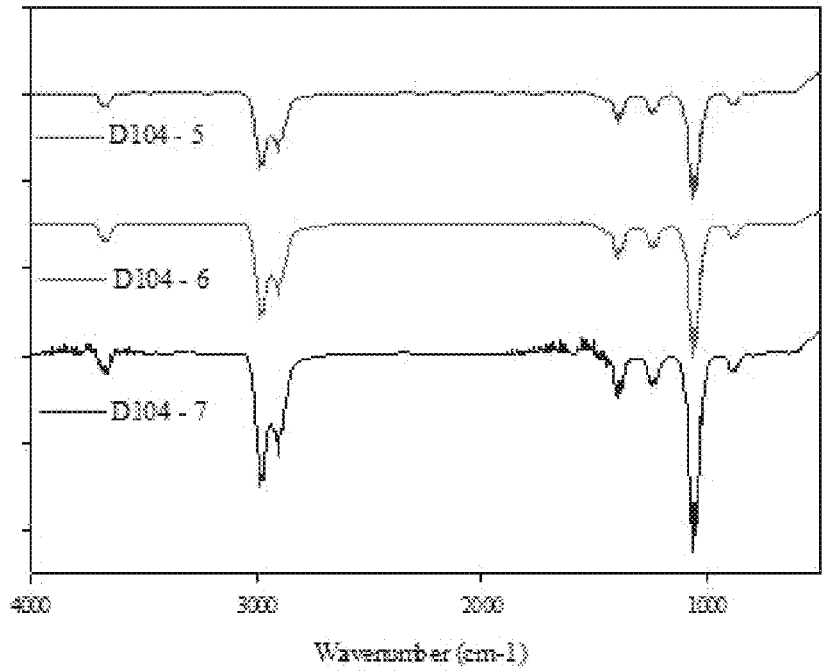
FIG. 5 shows the IR spectrum of the polishing slurry composition of the present invention.

FIG. 5 shows the IR spectrum of the polishing slurry composition of the present invention.

Through the IR spectrum, it was confirmed that the peak of the dispersant was detected at a similar point in all three types of slurries. Additionally, as the content of the dispersant increases, the peak of the dispersant can be seen gradually increasing.

Figure 6:
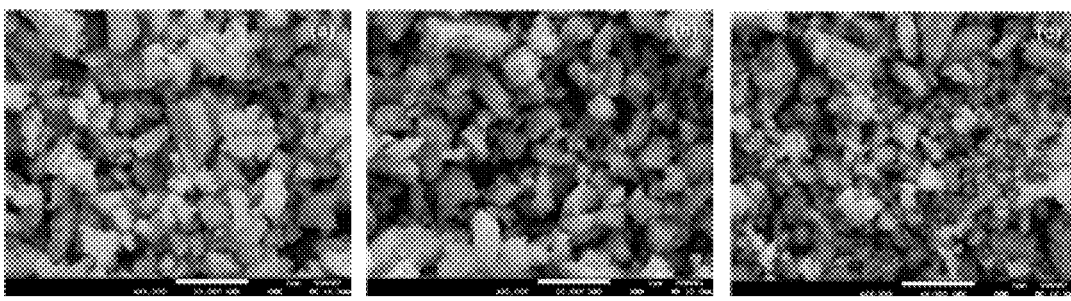
FIG. 6 shows an SEM image of the polishing slurry composition of the present invention.

FIG. 6 shows an SEM image of the polishing slurry composition of the present invention.

SEM analysis results show that as the dispersant content increases, the number of small particles gradually increases. This is because the higher the dispersant content, the better the dispersibility.

Figure 7:
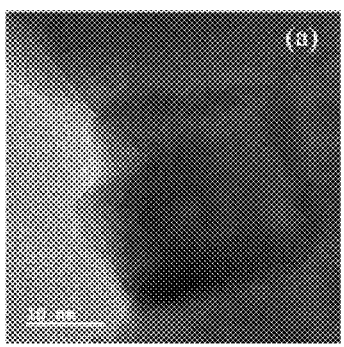
FIG. 7 shows a TEM image of the polishing slurry composition of the present invention.
Figure 7:
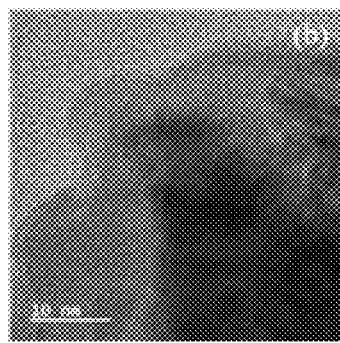
Figure 7:
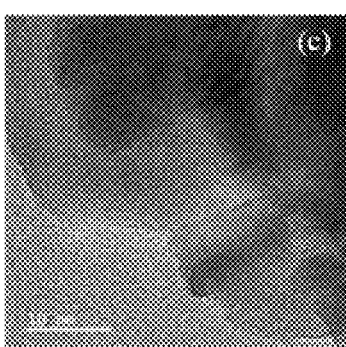

FIG. 7 shows a TEM image of the polishing slurry composition of the present invention.

As a result of the analysis, it was confirmed that as the content of the dispersant increased, the dispersant was stably adsorbed on the surface of the abrasive at a thicker thickness and had a constant orientation. Through this, defects such as scratches or defects due to uneven orientation during CMP polishing can be prevented.

Example 2

A polishing slurry composition was prepared in the same manner as Example 1, except that instead of 5% by weight of ethylene-acrylic acid copolymer, 3.5% by weight of ethylene-acrylic acid copolymer and 1.5% by weight of zinc salt of ethylene-acrylic acid copolymer were used.

Example 3

A polishing slurry composition was prepared in the same manner as Example 1, except that 5% by weight of the dispersant mixture was used instead of 5% by weight of the ethylene-acrylic acid copolymer.

The dispersant mixture includes ethylene-acrylic acid copolymer, zinc salt of ethylene-acrylic acid copolymer, and styrene-maleic acid copolymer, and the weight ratio of ethylene-acrylic acid copolymer, zinc salt of ethylene-acrylic acid copolymer, and styrene-maleic acid copolymer was 100:40:20.

Example 4

A silane coupling agent oligomer was prepared by reacting 3-methacryloxypropyltrimethoxysilane, 3-glycidoxypropyltrimethoxysilane, 2-hydroxyethyl acrylate (HEA), and 2-hydroxyethyl methacrylate (HEMA).

The weight ratio of 3-methacryloxypropyltrimethoxysilane, 3-glycidoxypropyltrimethoxysilane, 2-hydroxyethyl acrylate (HEA), and 2-hydroxyethyl methacrylate (HEMA) was 30:100:30:20.

A polishing slurry composition was prepared in the same manner as Example 1, except that 5% by weight of the silane coupling agent oligomer was additionally used.

Comparative Example 1

A polishing slurry composition was prepared in the same manner as Example 1, except that 5% by weight of sorbitan monolaurate was used instead of 5% by weight of ethylene-acrylic acid copolymer.

(Polishing Target)

The flat silicon oxide films (PE-TEOS) and polysilicon wafers (Poly) were used as wafers. The silicon oxide wafer is made by depositing PE-TEOS to a thickness of 10,000 Å on a silicon wafer. Polysilicon wafers are made by depositing polysilicon to a thickness of 3,000 Å on a silicon wafer.

(CMP Process Conditions)

The polishing process conditions are shown in Table 1 below.

TABLE 1

| CMP parameter | CMP condition |
|---|---|
| equipment | AP-300(CTS) |
| polishing pad | IC-1010(DAW) |
| Slurry inflow speed | 200 ml/min |
| head speed | 93 rpm |
| table speed | 87 rpm |
| pressure | 5.0 psi |
| polishing time | 60 sec |

(Polishing Speed)

The thickness of the specimen wafer before and after polishing was confirmed using ST-5030 (K-MAC Corp.). To prevent errors due to measurement, 49 identical points were measured in the X-axis direction from the center to the edge of each wafer and averaged (unit: Å/min).

(Uniformity)

After polishing, the uniformity of the specimen wafer was measured.

(Scratch or Not)

After polishing, the substrate was washed, and defects and scratches on the substrate were observed using an optical microscope and graded as very excellent, excellent, average, and poor.

The properties of the polishing slurry compositions obtained from the examples and comparative examples were measured and shown in Table 2 below.

TABLE 2

| | Polishing speed (Å/min) | | Uniformity | |
|---|---|---|---|---|
| | PE-TEOS | Poly | (%) | Scratch or not |
| Example 1 | 4,209 | 1,439 | 14.5 | excellent |
| Example 2 | 5,108 | 1,527 | 11.6 | very excellent |
| Example 3 | 5,311 | 1,508 | 10.8 | very excellent |
| Example 4 | 5,572 | 1,522 | 8.7 | very excellent |
| Comparative Example 1 | 3,043 | 1,296 | 21.3 | poor |

From the results in Table 2, it can be seen that in Examples 1 to 4, the polishing speed increases, the uniformity is improved, and the occurrence of scratches is minimized. In particular, it can be confirmed that Examples 2 to 4 have the best properties.

On the other hand, it can be seen that the characteristics of Comparative Example 1 are inferior to those of the Example.

The invention claimed is:

1. A polishing slurry composition comprising:
   (a) one or more abrasives selected from the group consisting of aluminum oxide, silicon oxide, zirconium oxide and cerium oxide;
   (b) a dispersant comprising ethylene-acrylic acid copolymer, salt of ethylene-acrylic acid copolymer, and styrene-maleic acid copolymer;
   (c) a silane coupling agent oligomer; and
   (d) a liquid carrier, wherein the composition comprises 5 to 45% by weight of an abrasive, 1 to 15% by weight of dispersant, 2 to 10% by weight of a silane coupling agent oligomer, and the remaining amount of a liquid carrier, a weight ratio of ethylene-acrylic acid copolymer, salt of ethylene-acrylic acid copolymer, and styrene-maleic acid copolymer is 100:30 to 50:10 to 30, the silane coupling agent oligomer is prepared by reacting an acrylate group-containing silane coupling agent, an epoxy group-containing silane coupling agent, 2-hydroxyethyl acrylate (HEA), and 2-hydroxyethyl methacrylate (HEMA), a weight ratio of the acrylate group-containing silane coupling agent, the epoxy group-containing silane coupling agent, 2-hydroxyethyl acrylate (HEA), and 2-hydroxyethyl methacrylate (HEMA) is 10 to 40:100:20 to 50:10 to 30, and a weight average molecular weight of the silane coupling agent oligomer is 5,000 to 50,000 g/mol.

2. A polishing slurry composition according to claim 1, wherein the abrasive is cerium oxide.

3. A polishing slurry composition according to claim 2, wherein the composition further comprises one or more pH adjusters selected from the group consisting of trimethanolamine, triethanolamine, trimethylammonium hydroxide, triethylammonium hydroxide, dimethylbenzylamine, ethoxybenzylamine, sodium hydroxide, and potassium hydroxide.

\* \* \* \* \*